United States Patent
Mujtaba et al.

(10) Patent No.: US 7,355,477 B2
(45) Date of Patent: Apr. 8, 2008

(54) TRANSMITTER POWER CONTROL LOOP FOR HIGH-SPEED WIRELESS LANS

(75) Inventors: Syed Aon Mujtaba, Watchung, NJ (US); Edward E. Campbell, Blandon, PA (US)

(73) Assignee: Agere Systems Inc., Allentown, PA (US)

( * ) Notice: Subject to any disclaimer, the term of this patent is extended or adjusted under 35 U.S.C. 154(b) by 108 days.

(21) Appl. No.: 11/423,759

(22) Filed: Jun. 13, 2006

(65) Prior Publication Data

US 2007/0285170 A1    Dec. 13, 2007

(51) Int. Cl.
*H03G 3/10* (2006.01)
(52) U.S. Cl. ............... 330/285; 330/296; 330/134
(58) Field of Classification Search ........ 330/285, 330/296, 134
See application file for complete search history.

(56) References Cited

U.S. PATENT DOCUMENTS

| | | | | |
|---|---|---|---|---|
| 5,812,572 | A  * | 9/1998 | King et al. | 372/38.04 |
| 6,414,974 | B1 * | 7/2002 | Russell et al. | 372/38.02 |
| 6,907,025 | B2   | 6/2005 | Demir et al. | |
| 7,157,974 | B2 * | 1/2007 | Grillo et al. | 330/285 |
| 7,215,198 | B1 * | 5/2007 | Dasgupta | 330/256 |
| 7,215,199 | B2 * | 5/2007 | Marholev | 330/258 |

* cited by examiner

*Primary Examiner*—Patricia Nguyen
(74) *Attorney, Agent, or Firm*—Synnestvedt & Lechner LLP

(57) ABSTRACT

A low cost, robust method and apparatus for controlling the gain of a power amplifier to compensate for changes that are gradual with time. The bias circuit of a power amplifier is sent one of three signals in response to a measurement of the average output power level of the power amplifier. If the average output power lever is less than a desired value, a signal to increment the bias current by a set amount is sent, so that the output power increases. If the average output power lever is more than the desired value, a signal to decrement the bias current by a set amount is sent. A third signal may be sent that causes the bias circuit to reset to a default value. The three signals may be sent as a two bit digital signal.

20 Claims, 3 Drawing Sheets

PRIOR ART

TRANSMITTER POWER CONTROL LOOP FOR HIGH-SPEED WIRELESS LANS

FIELD OF THE INVENTION

The present invention relates to a feedback mechanism that adjusts transmitter gain in discrete steps to provide a relatively constant antenna output power in a Local Area Network (LAN) transmitter system.

BACKGROUND OF THE INVENTION

In order for high-speed wireless networks to operate effectively, it is important that the transmitting channel maintain a stable average power for its transmissions. This stable level of transmission is particularly important to the receiving channel of the network.

FIG. 1 is a schematic drawing of a typical physical layer architecture (PHY) for a transmitter. The particular circuit illustrated in FIG. 1 is the PHY for a Single-Input Single-Output (SISO) system using Orthogonal Frequency Division Multiplexing (OFDM), as used in various wireless Large Area Network (LAN) architectures, including the IEEE standard Multi-Mode 802.11 a/b/g (also known as Wifi) and High-Speed 802.11n architectures. This PHY transmission chain includes four main physical modules. The Medium Access Control (MAC) layer 102 is the link between the logical layers of the network and the physical layer. This module effectively requests a particular setting or value for the average output power level of the transmission. The digital signal processor (DSP) 110 is the module that generates the coded signal and converts it from a digital signal to an analogue radio frequency (RF) signal using two digital-to-analogue converters (DAC) 118. The radio frequency integrated circuit (RFIC) 120 mixes the quadrature and in-phase signals to provide the final signal to be transmitted. The forth module is the power amplifier (PA) module 130 that boosts the power level of the signal to the required output power level before it reaches the transmission antenna 144.

The average transmitted RF power level 142 is equal to the average input RF power level 132 supplied to the power amplifier (PA) 134 multiplied by the gain of the PA 134. The average input RF power level 132 is set at two points in the transmission chain. The transmission power control (TPC) fine register 146 in the MAC layer 102 controls the input to the DACs 118, providing control of the input RF power level 132 to 0.25 dB resolution. The transmission power control (TPC) coarse register 148 controls the radio frequency (RF) attenuator 126 on the RFIC 120 providing control of the average input RF power level 132 with 2 dB resolution.

Proper operation of the receiver unit of the wireless network requires a steady average transmitted RF power level 142. As seen from the discussion of the PHY layout above, the MAC layer 102, via its transmission power control registers, only has effective control of the average input RF power level 132. The transmission power control algorithm effectively assumes that the gain of the power amplifier (PA) module 130 is invariant with time. Temperature variations, however, cause the gain of the PA 134 to vary. To maintain a constant transmitted RF power level 142 it is necessary to add a feed back loop that compensates for temperature and keeps the gain of the PA 134 at a constant value. This is typically accomplished by having a diode detector 139 monitor the transmitted RF power level 142 and relay the result to a 7-bit auxiliary ADC 150 on the digital signal processor (DSP) 110. The DSP 110 runs an appropriate algorithm to monitor average output power and uses a 6-bit power DAC 119 to adjust the PA gain appropriately by setting the value of the PA bias current via the PA bias 138.

The details of such prior art power amplifier (PA) control circuits are discussed in detail in, for instance, U.S. Pat. No. 6,907,025 issued to Demir et al. on Jun. 14, 2005, which is hereby incorporated by reference.

Such methods of controlling the PA gain are well suited to situations where the gain may vary rapidly. In a typical LAN transmitter PHY, the variation in transmitted RF power level due to PA gain change with temperature happens relatively slowly. What is needed is a lower cost method to control the gain of a power amplifier to compensate for variations that are gradual with time.

SUMMARY OF THE INVENTION

Briefly described, the invention provides a low cost, robust method and apparatus for controlling the gain of a power amplifier to compensate for changes that are gradual with time.

In a preferred embodiment of the invention, the bias circuit of a power amplifier is sent one of three signals in response to a measurement of the average output power level of the power amplifier. If the average output power lever is less than a desired value by more than a predetermined amount, the bias circuit is sent a signal to increment the value of the bias current by a set amount, so that the output power increases. If the average output power lever is more than the desired value by more than a predetermined amount, the bias circuit is sent a signal to decrement the value of the bias current by a set amount, so that the output power decreases. A third signal may be sent that causes the bias circuit to reset to a default value that may, for instance, be the factory preset value.

Incrementing or decrementing the bias current by a preset amount may be repeated until the average output power lever is at a required level or within a required range.

In a preferred embodiment of the invention, the three signals are sent as a two bit digital signal with the first bit either decrementing or incrementing the bias current if the second bit is set to logical zero, and resetting the bias current if the second bit is set to logical one.

Such a power amplifier gain control loop is simpler and cheaper than prior art gain control loops. In addition, the gain control loop of this invention has the advantage of being more robust in responding to slow variations in gain. This robustness is due to the control signal being sent as a digital signal rather than as an analog value that is more susceptible to noise.

These and other features of the invention will be more fully understood by references to the following drawings.

DETAILED DESCRIPTION

The present invention concerns methods and apparatus for controlling the gain of power amplifiers. In particular the present invention provides a low cost and robust method for controlling the gain of a power amplifier in order to compensate for variations in amplifier gain that are gradual with time such as, but not limited to, gain variations due to ambient temperature changes.

A preferred embodiment of the amplifier gain control is particularly applicable to transmitters for wireless networks. In this preferred embodiment, a feedback loop controls the power amplifier bias current by simply incrementing the bias current by a preset amount if the gain is less than a desired value. This preset increment in the bias current may be repeated until the gain is at a desired value or within a desired range. Conversely, if the gain is more than the desired value, the bias current is decremented by a preset amount. The decrementing by the preset amount may be repeated until the gain is at the desired value or within the desired range.

A preferred embodiment of the invention will now be described in detail by reference to the accompanying drawings in which, as far as possible, like elements are designated by like numbers.

Figure 1:
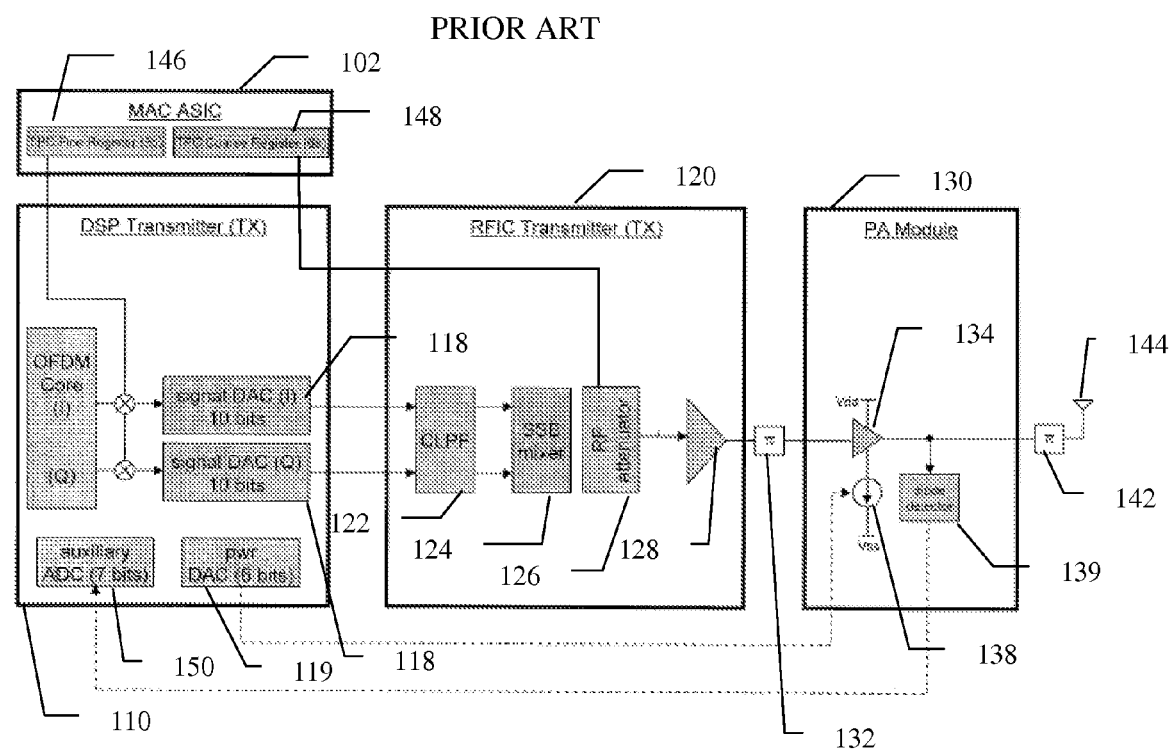
FIG. 1 is a schematic drawing of a transmitter physical layer architecture using a prior art power amplifier control loop.
Figure 2:
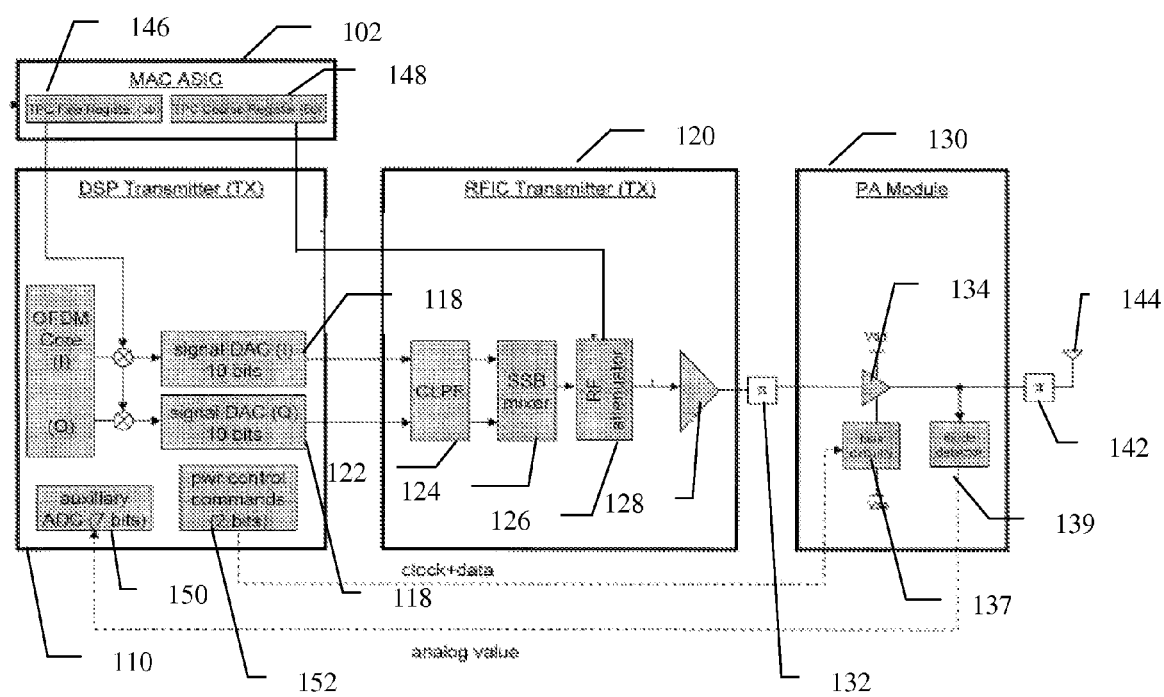
FIG. 2 is a schematic drawing of a transmitter physical layer architecture using a power amplifier control loop of one embodiment of this invention.

FIG. 2 is a schematic drawing of a typical physical layer architecture (PHY) for a transmitter that incorporates a feed back loop for controlling the gain of the power amplifier in accordance with a preferred embodiment of the invention. The particular circuit illustrated in FIG. 1 is the PHY for a Single Input-Single Output (SISO) system using Orthogonal Frequency Division Multiplexing (OFDM), as used in various wireless Large Area Network (LAN) architectures, including the IEEE standard Multi-Mode 802.11 a/b/g (also known as Wifi) and High-Speed 802.11n architectures. The PHY transmission chain includes four main physical modules. The Medium Access Control (MAC) layer 102 is the link between the logical layers of the network and the physical layer. This module effectively requests a particular setting or value for the average output power level of the transmission. The digital signal processor (DSP) 110 is the module that generates the coded signal and converts it from a digital signal to an analogue radio frequency (RF) signal using two digital-to-analogue converters (DAC) 118. The radio frequency integrated circuit (RFIC) 120 mixes the quadrature and in-phase signals to provide the final signal to be transmitted. The forth module is the power amplifier (PA) module 130 that boosts the power level of the signal to the required output power level before it reaches the transmission antenna 144.

As detailed above, proper operation of the receiver unit of the wireless network requires a steady average transmitted RF power level 142. As seen from the discussion of the PHY layout above, the MAC layer 102, via its transmission power control registers, only has effective control of the average input RF power level 132. The transmission power control algorithm effectively assumes that the gain of the power amplifier (PA) module 130 is invariant with time. Temperature variations, however, cause the gain of the PA 134 to vary. To maintain a constant average transmitted RF power level 142 it is necessary to add a feed back loop that compensates for temperature and keeps the gain of the PA 134 at a constant value.

In a preferred embodiment of the invention, the gain control feed back loop is provided by a diode detector 139 that monitors the transmitted RF power level 142 of the power amplifier (PA) 134. This monitored value is relayed as an analogue signal to a 7-bit auxiliary ADC 150 on the digital signal processor (DSP) 110. A module running a gain control algorithm that preferably operates locally on the DSP 110, determines if the average transmitted RF power level 142 is at a required level, or within a required range of values.

If the average transmitted RF power level 142 is too low, a power control unit 152 on the DSP 110 sends a digital signal to the PA bias circuitry 137 that causes the PA bias current to be incremented by a set amount. This increases the gain of the PA and boosts the average transmitted RF power level 142. The diode detector 139 makes a further measurement of the transmitted RF power level 142 and once again relays the result back to the gain control algorithm that may be running on the DSP 110. If the increase was insufficient and the average output power is still too low a further signal to boost the bias current and hence the gain of the PA 134 may be sent. These steps of monitoring the average transmitted RF power level 142 and incrementing the PA bias current by a preset, fixed amount may be repeated until the average transmitted RF power level 142 is at the required level or within a required range.

Similarly, if the average transmitted RF power level 142 is too high, a power control unit 152 on the DSP 110 sends a digital signal to the PA bias circuitry 137 that causes the PA bias current to be decremented by a preset, fixed amount. This decreases the gain of the PA and reduces the average transmitted RF power level 142. The diode detector 139 makes a further measurement of the transmitted RF power level 142 and once again relays the result back to the gain control algorithm that may be running on the DSP 110. If the decrease was insufficient and the average output power is still too high a further signal to reduce the bias current and hence the gain of the PA 134 is sent. These steps of monitoring the transmitted RF power level 142 and decrementing the PA bias current by a preset, fixed amount may be repeated until the average transmitted RF power level 142 is at the required level or within a required range.

In comparing the monitored transmitted RF power level 142 to a required average power level, the difference in values should be greater than a predetermined minimum value before a signal to increment or decrement is sent in order to avoid unnecessary oscillations. For instance if the predetermined minimum difference is equal to half the amount of change in the transmitted RF power level 142 that an increment or decrement signal causes, the control system should not oscillate. If the minimum difference is, however, less than half the increment the system may oscillate back and forth as alternating signals to increment or decrement are sent, without ever stabilizing.

In a preferred embodiment of the control loop of this invention, a third signal may be sent as a digital signal from the power control unit 152 on the DSP 110. This is a signal that resets the current in the PA bias circuitry 137 to a predetermined level, or default level that may for instance be factory preset level.

In a preferred embodiment of the invention, the digital signal sent from the power control unit 152 to the PA bias circuitry 137 may take the form of a two bit binary signal. This may be encoded such that, for instance, the first bit causes the bias current to be increased if it is set to a logical 1 and the second bit is set to logical zero. The first bit may causes the bias current to be decreased if it is set to a logical 0 and the second bit is set to logical zero. If the second bit is set to a logical 1, the bias current may be reset to the default value.

Figure 3:
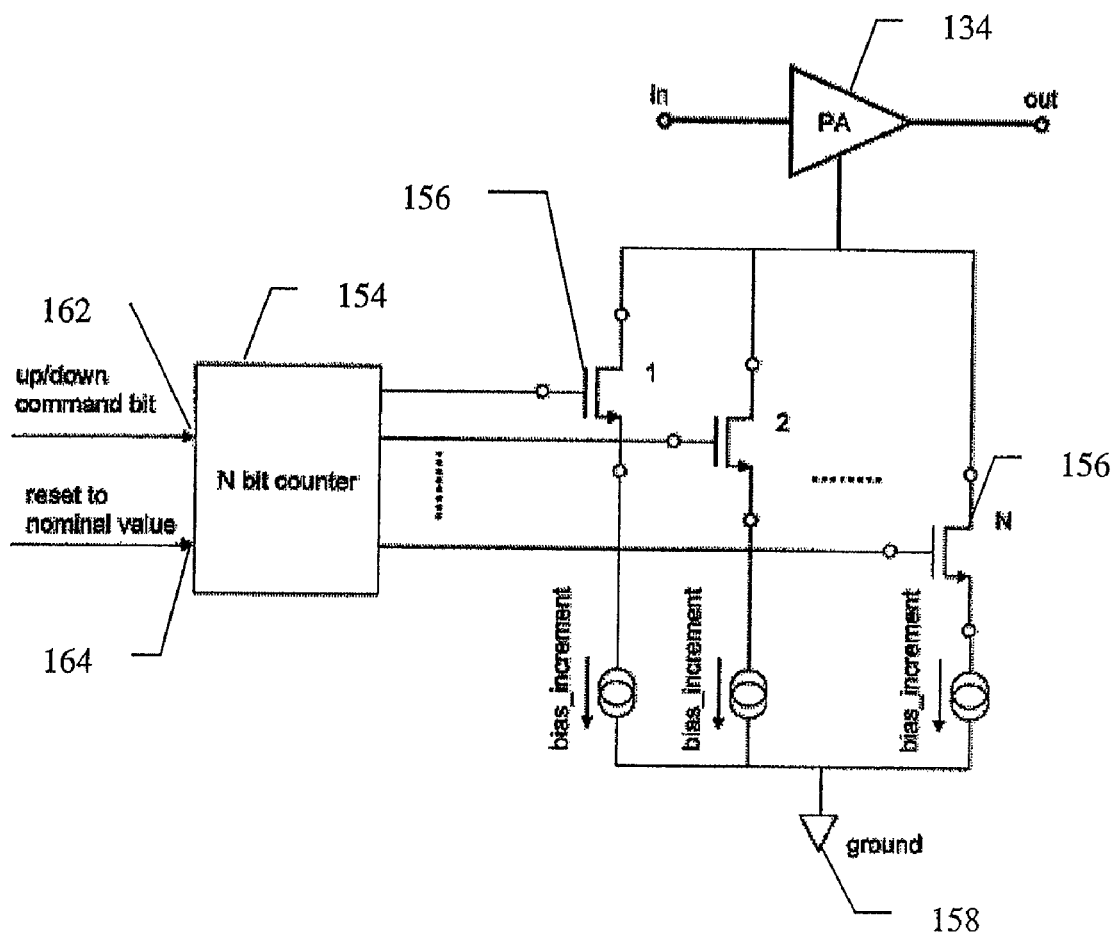
FIG. 3 is a schematic drawing of a power amplifier bias circuit.

FIG. 3 is a schematic drawing of a power amplifier bias circuit used in a preferred embodiment of the PA gain control circuit. The PA bias circuit 137 includes an N-bit counter 154 and a number of field effect transistors 156. The field effect transistors 156 are connected in parallel between a bias terminal 160 of the power amplifier (PA) 134 and a ground terminal 158. The N-bit counter 154 is connected to a gate terminal of the field effect transistors 156, such that the number of field effect transistors 156 that are on and contributing to the bias current is proportional to the number the N-bit counter 154 has counted to. The first bit relayed from the power control unit 152 may, for instance, be sent to a first terminal 162 of the N-bit counter 154 where it either causes the N-bit counter 154 to either count up or down depending on the logical value of the first bit. Similarly, the second bit relayed from the power control unit 152 may, for instance, be sent to a second terminal 164 of the N-bit counter 154 where it causes the N-bit counter 154 to reset to a default number that provide a default bias current. In a preferred embodiment, the N bit counter may be, but is not limited to, a 16 bit counter that covers +/−2 dB or 4 dB total range of gain variation in 0.25 dB bias steps.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention. Modifications may readily be devised by those ordinarily skilled in the art without departing from the spirit or scope of the present invention.

What is claimed is:

1. A method of controlling the gain of a power amplifier, said method comprising the steps of:
   1) monitoring an average output power level of said power amplifier;
   2) if said average output power level is less than a required value by more than a predetermined amount, increasing the bias current of said power amplifier by a fixed amount; and
   3) if said average output power level is more than said required value by more than said predetermined amount, decreasing said bias current of said power amplifier by said fixed amount.

2. The method of claim 1 further comprising the step of repeating steps 1 to 3 until the difference between said monitored level and said required level is less than said predetermined minimum difference.

3. The method of claim 2 wherein said predetermined amount is more than or equal to half a change in output power of said power amplifier effected by increasing said bias current of said power amplifier by said fixed amount.

4. The method of claim 3 wherein step 2 comprises supplying a control signal having a first value to a bias control circuit of said power amplifier, said bias control circuit adapted to increases said bias current by said fixed amount responsive to said control signal having a first value; and wherein step 3 comprises supplying a control signal having a second value to a bias control circuit of said power amplifier, said bias control circuit adapted to decreases said bias current by said fixed amount responsive to said control signal having said second value.

5. The method of claim 4 further comprising the step of resetting said bias current to a reset value using a third value of said control signal.

6. The method of claim 5 wherein said control signal is a two-bit digital signal.

7. The method of claim 6 wherein step 1 comprises sensing an output current using a diode detector.

8. A device for controlling the gain of a power amplifier, comprising:
   a monitor for measuring an output power level of said power amplifier;
   a bias circuit for controlling a gain of said power amplifier; and
   a digital signal processor programmed to use said measured output power level to determine an average output power level and if said average output power level is less than a required value by more than a predetermined amount, to provide a control signal having a first value to said bias circuit to increase the bias current of said power amplifier by a fixed amount, or, if said average output power level is more than said required value by more than said predetermined amount, to provide said control signal having a second value to said bias circuit to decrease said bias current of said power amplifier by said fixed amount.

9. The device of claim 8 wherein said predetermined amount is more than or equal to half a change in output power of said power amplifier effected by increasing said bias current of said power amplifier by said fixed amount.

10. The device of claim 9 wherein said control signal has a third value that resets said bias current to a predetermined value.

11. The device of claim 10 wherein said control signal is a two-bit digital signal.

12. The device of claim 11 wherein said bias circuit comprises an N-bit counter controlling a plurality of current switches connected in parallel between a bias terminal of said power amplifier and a ground terminal.

13. The device of claim 12 wherein said plurality of current switches are field effect transistors.

14. The device of claim 13 wherein said monitor comprises a diode detector.

15. An apparatus of controlling the gain of a power amplifier, comprising:
   means for monitoring an average output power level of said power amplifier; and
   means for comparing said average power level to a required value and if said average output power level is less than said required value by more than a predetermined minimum difference, increasing the bias current of said power amplifier by a preset, fixed amount, or, if said average output power level is more than said required value by more than said predetermined minimum difference, decreasing said bias current of said power amplifier by said preset, fixed amount.

16. The apparatus of claim 15 wherein said predetermined minimum difference is more than or equal to half the change in output power of said power amplifier effected by increasing said bias current of said power amplifier by said preset, fixed amount.

17. The apparatus of claim 16 wherein said means for comparing comprises means for supplying a control signal to a bias control circuit of said power amplifier and wherein a first value of said control signal increases said bias current by said fixed amount, a second value of said control signal decreases said bias current by said fixed amount, and a third value of said control signal resets said bias current to a predetermined value.

18. The apparatus of claim 17 wherein said control signal is a two-bit signal digital signal.

19. The apparatus of claim 18 wherein said bias circuit comprises an N-bit counter controlling a plurality of current switches connected in parallel between a bias terminal of said power amplifier and a ground terminal.

20. The apparatus of claim 19 wherein said plurality of current switches are field effect transistors.

* * * * *